United States Patent [19]
Martinez et al.

[11] Patent Number: 5,624,750
[45] Date of Patent: Apr. 29, 1997

[54] ADHESIVE HEATER AND METHOD FOR SECURING AN OBJECT TO A SURFACE

[75] Inventors: Jose A. Martinez, Garden Grove; Louis E. Gates, Jr., Westlake Village, both of Calif.

[73] Assignee: Hughes Electronics, Los Angeles, Calif.

[21] Appl. No.: 450,455

[22] Filed: May 25, 1995

[51] Int. Cl.$^6$ ................................................. C09J 7/02
[52] U.S. Cl. .................. 428/344; 156/273.9; 156/308.2; 428/354
[58] Field of Search ...................... 428/344, 354; 156/308.2, 273.9

[56] References Cited

U.S. PATENT DOCUMENTS

| | | | |
|---|---|---|---|
| 4,110,506 | 8/1978 | Cottingham | 428/344 |
| 4,251,712 | 2/1981 | Parr | 428/344 |
| 5,340,649 | 8/1994 | Roeker | 428/344 |
| 5,433,804 | 7/1995 | Nottingham | 428/344 |

*Primary Examiner*—Jenna Davis
*Attorney, Agent, or Firm*—Leonard A. Alkov; Wanda K. Denson-Low

[57] ABSTRACT

A heater assembly and a method for securing and removing an object, such as a ceramic package to and from a surface, such as the surface of circuit module or printed wiring board, for example. The heater assembly includes a heater element such as a foil (film or wire) element, embedded or sandwiched between two layers of adhesive, such as thermoplastic adhesive. The layers of adhesive may contain a dielectric filler material with relatively high thermal conductivity to enhance heat transfer capabilities through the heater assembly. Two heater electrodes protrude from the heater assembly and are not encapsulated by the layers of adhesive and are accessible so that voltage may be applied to the heater element. During use, the heater assembly is disposed between the base of the object and the surface to which it is to be secured. A predetermined low voltage is applied to exposed heater electrodes to activate the heater element, whereupon heat generated by the heater element softens the layers of adhesive. When the voltage is removed, the layers of adhesive solidify and bond the object firmly to the surface. When bonding a ceramic package to a circuit board, for example, the use of layers of adhesive containing dielectric filler material having a relatively high thermal conductivity enhances heat transfer from the package to the circuit board, or to a heat sink upon which it typically mounted. If the object needs to be removed for repair or replacement, voltage is reapplied to the heater electrodes, whereupon the layers of adhesive soften and the object is removed.

13 Claims, 2 Drawing Sheets

ADHESIVE HEATER AND METHOD FOR SECURING AN OBJECT TO A SURFACE

BACKGROUND

The present invention generally relates to bonding methods and apparatus, and more particularly, to an improved heater and bonding method for use in securing an object to a surface.

Prior art relating to the present invention includes mounting ceramic packages such as multichip modules on a circuit module using a thermosetting paste adhesive such as polysulfide. A layer of paste adhesive is applied either to the bottom of the multichip module or directly to the surface of the circuit module. The multichip module is then very carefully positioned, weighted and fixtured onto the adhesive paste such that no sliding movement takes place, and the assembly is placed in an oven to cure the adhesive.

Typical adhesives used for this purpose do not have very high thermal conductivity, which adversely affects the performance of some multichip modules where it is important to remove heat from the module to a heat sink. If the multichip module must be removed from the circuit module for repair, rework, or replacement, it is very difficult to heat the assembly to a high enough temperature to facilitate removal without endangering the components of the multichip module, or the circuit module to which the multichip module is mounted. It is also awkward to fixture the multichip module onto the paste adhesive layer such that it maintains alignment in the required location, and to maintain proper thickness control of the adhesive layer.

The conventional method of bonding multichip modules comprises bonding it with a thermosetting adhesive, typically a polysulfide material, and curing the adhesive in an oven. If the multichip module must be removed for rework or replacement, the entire assembly is heated with hot gas or other suitable means to soften the adhesive and the multichip module is twisted or pried off the module. Polysulfide and other similar adhesives are very tenacious. Often, the package of the multichip module is broken during removal because of high stresses imposed on the package during removal. It is also very difficult and costly to clean the residual thermoset adhesive off the package and the multichip module.

Therefore, it is an objective of the present invention to provide for an adhesive heater and bonding method for use in securing an object to a surface. It is a further objective of the present invention to provide for a adhesive heater and bonding method for use in securing ceramic packages to cimuit modules.

SUMMARY OF THE INVENTION

In order to meet the above and other objectives, the present invention comprises a heater assembly and a method of securing and removing an object, such as a ceramic package, to and from a surface, such as a circuit module printed wiring board, for example. The heater assembly is comprised of a foil (film or wire) heater element embedded or sandwiched between two layers of adhesive, such as thermoplastic adhesive. Two heater electrodes protrude from the heater and are not encapsulated by the layers of adhesive and are accessible so that voltage may be applied thereto during use. The layers of adhesive may contain a dielectric filler having relatively high thermal conductivity to enhance the heat transfer capability of the heater.

During use, the heater assembly is disposed between the base of the object that is to be secured and the surface. For example, the heater may be disposed between the base of a ceramic package and a printed wiring board or heat sink of a circuit module. Thereafter, a predetermined low voltage, on the order of 60–70 volts, for example, is applied to heater electrodes to activate the heater element, whereupon heat generated by the heater element softens the layers of adhesive. When the voltage is removed, the layers of adhesive solidify and bond the object (package) firmly to the surface (circuit board). With regard to the bonding of ceramic packages, the use of an adhesive containing dielectric filler material having a relatively high thermal conductivity ($\geq 1$ watt/inch°C.) enhances heat transfer from the package to the surface of the circuit board, or to a heat sink upon which the it is typically mounted. If object or package needs to be removed for repair or replacement, voltage is reapplied to the heater electrodes, whereupon the adhesive softens and the object or package may be readily removed.

The present method of mounting an object, such as a ceramic package or multichip module to a surface, such as the surface of a printed wiring board comprises the steps of fabricating a heater assembly comprising a heating element disposed between two layers of thermoplastic adhesive. The next step comprises disposing the heater assembly at the proper position on the surface of the circuit module to which the object is to be secured. The object is then positioned on the heater assembly. Voltage is applied to the exposed electrodes of the heater assembly. Moderate pressure is applied to the object while the adhesive softens, and upon removing the voltage, the adhesive solidifies, firmly bonding the multichip module to the circuit module.

If the object must later be removed or replaced, voltage is reapplied to the heater electrodes whereupon the adhesive readily softens and the object is easily removed without excessive stress being applied thereto. Because it is thermoplastic material, the adhesive residue produced by using the present invention is very easily and inexpensively cleaned off the circuit module printed wiring board and ceramic package by the application of heat from a "hot air" type heater.

The present invention has a substantial impact on lowering assembly and rework costs wherever multichip modules or other devices or objects must be adhesively bonded to a surface. The present invention may be used in other applications not necessarily involving multichip modules, and include applications where an object must be bonded to a surface where it is impractical or hazardous to use externally applied heat to mount or remove the object from a surface. Examples include mounting an object on an enclosure, instruments that periodically must be removed for calibration, installing filter bases in a power supply, fastening semi-permanent notices to a surface, and the like. The thermoplastic adhesive may include appropriate filler materials to enhance thermal conductivity, or color identification, for example, if desired.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
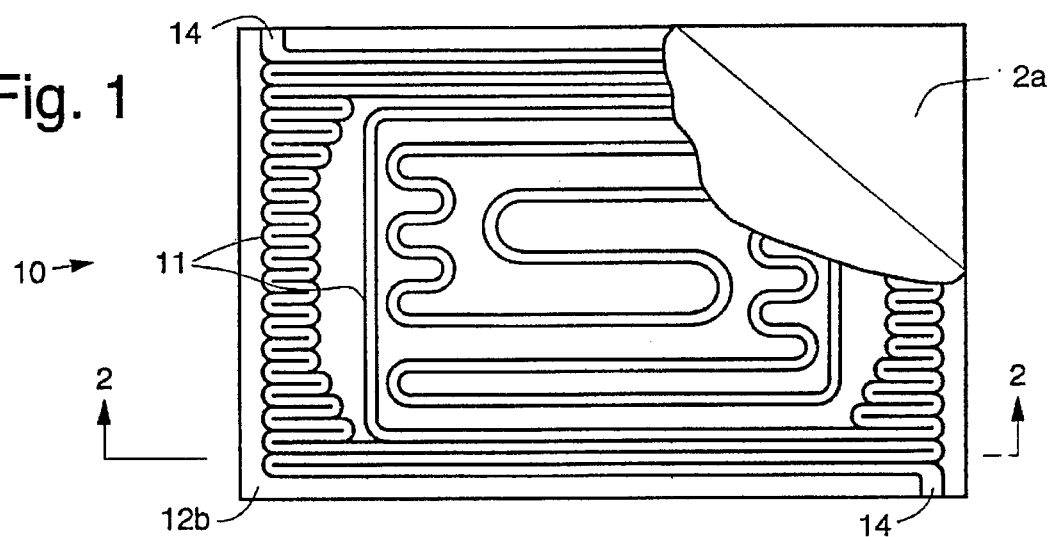
FIG. 1 illustrates a partially exposed top view of a heater assembly in accordance with the principles of the present invention.
Figure 2:
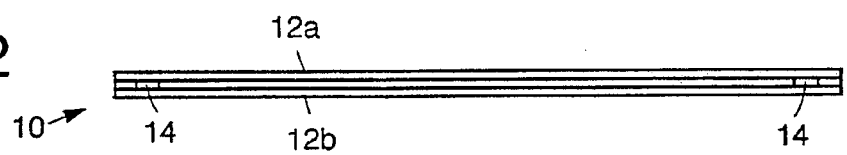
FIG. 2 illustrates a cross sectional side view of the heater assembly of FIG. 1 taken along the lines 2—2 in FIG. 1.

Referring to the drawing figures, the present invention is a laminated adhesive heater assembly 10 that may be used to inexpensively secure an object 15 (FIG. 4) to a surface 16 (FIG. 4) and remove the object 15 from the surface 16. More particularly, FIG. 1 illustrates a partially exposed top view of the heater assembly 10 in accordance with the principles of the present invention. FIG. 2 illustrates a cross sectional side view of the heater assembly 10 of FIG. 1, taken along the lines 2—2 in FIG. 1.

The heater assembly 10 comprises a patterned film heater element 11 embedded between two sheets or layers 12a, 12b of thermoplastic adhesive film. The layers 12a, 12b of adhesive may contain a dielectric filler material such as aluminum nitride powder, for example, that has a relatively high thermal conductivity ($\geq 1$ watt/inch°C.). The heater element 11 is patterned in a configuration to provide a uniform distribution of heat over the surface of the object 15 that is to be mounted and secured so that heat drainage from the edges of the object 15 are balanced with a higher heating density at the edges than at the center of the object 15. This assures that the temperature throughout the interface between the adhesive layer 12b and the surface 16 will be maintained nearly constant when the heater assembly 10 is activated.

A typical configuration for the heater assembly 10 is shown in FIGS. 1 and 2. When the heater element 11 is laminated between the two sheets 12a, 12b of adhesive film, two heater electrodes 14 are exposed so that they are accessible. The particular adhesive used in a reduced-to-practice embodiment of the present invention is Staysilk 672, manufactured by Alpha Metals, Jersey City, N.J. This adhesive material is a urethane film containing aluminum nitride filler material. The heater element 11 was chemically etched from Monel™ metal alloy. Other metal resistance alloys such and Inconel™ or nichrome may also be used as the heater element 11 depending on the desired applied voltage and wattage required for mounting the object 15.

Figure 3:
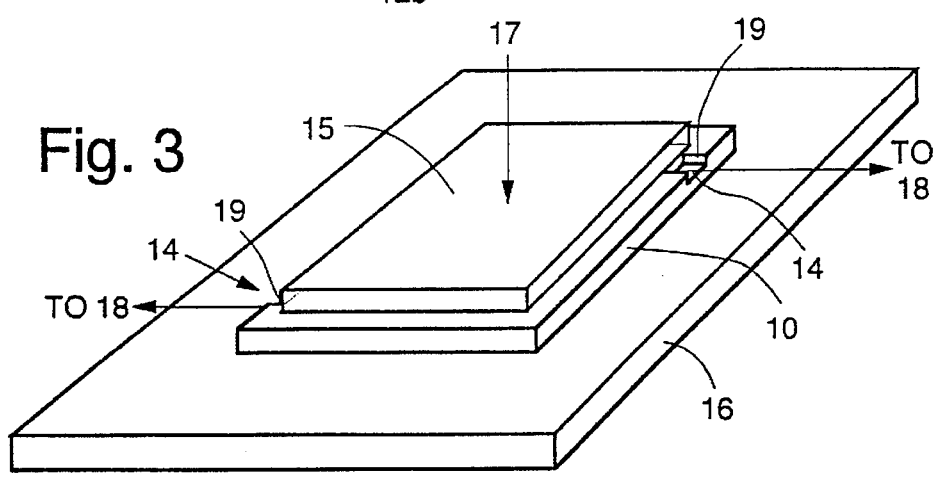
FIG. 3 illustrates a perspective view of an object secured using the heater assembly of the present invention.

Referring to FIG. 3, it shows an object 15 secured to a surface 16 using the heater assembly 10 of the present invention. A typical multichip module (object 15) to circuit module assembly (surface 16) is shown in FIG. 3. To mount the object 15 to the surface 16, such as securing a multichip module to a circuit module, for example, the heater assembly 10 is positioned between the object 15 and the surface 16 to which it is to be secured. A positive pressure, such as is provided by a weight 17 (illustrated by arrow 17), for example, may be applied to the object 15, and voltage from a voltage source 18 is applied to the heater electrodes 14. The voltage may be on the order of 60–70 volts, for example. Upon self-heating of the heater assembly 10, the layers 12a, 12b of adhesive film soften, effecting a bond between the object 15 and the surface 16 when voltage is removed from the heater electrodes 14.

When it is necessary to remove the object 15 from the surface 16 to which it is secured, the process is reversed. Voltage is reapplied to the heater electrodes 14, thereby causing it to soften the layers 12a, 12b of adhesive film such that the object 15 may be readily removed from the surface 16. To remove adhesive residue from the object 15 and surface 16, hot air may be directed onto the remaining adhesive, softening it for easy removal and cleanup.

Figure 4:
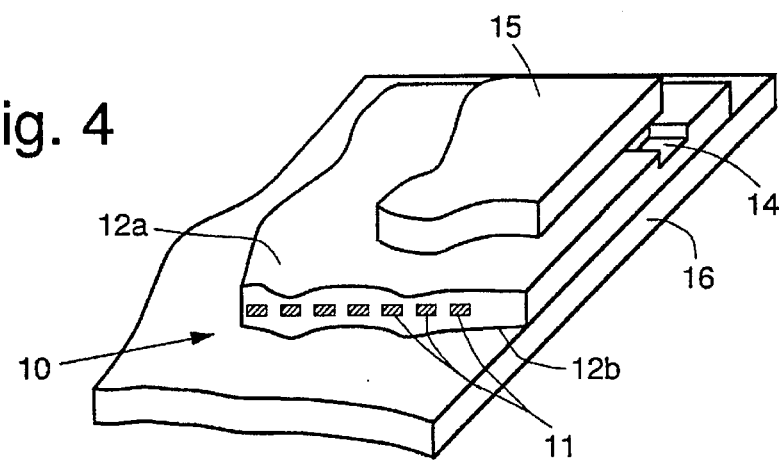
FIG. 4 illustrates an enlarged perspective view of a portion of FIG. 3.

FIG. 4 illustrates an enlarged perspective view of a portion of FIG. 3 showing the heater assembly 10 in more detail. The filaments of the heater element 11 are shown embedded in or between the layers 12a, 12b of thermoplastic adhesive film. Two cutouts 19 or indentations 19 are provided in the top layer 12a of thermoplastic adhesive film that expose the heater electrodes 14.

Figure 5:
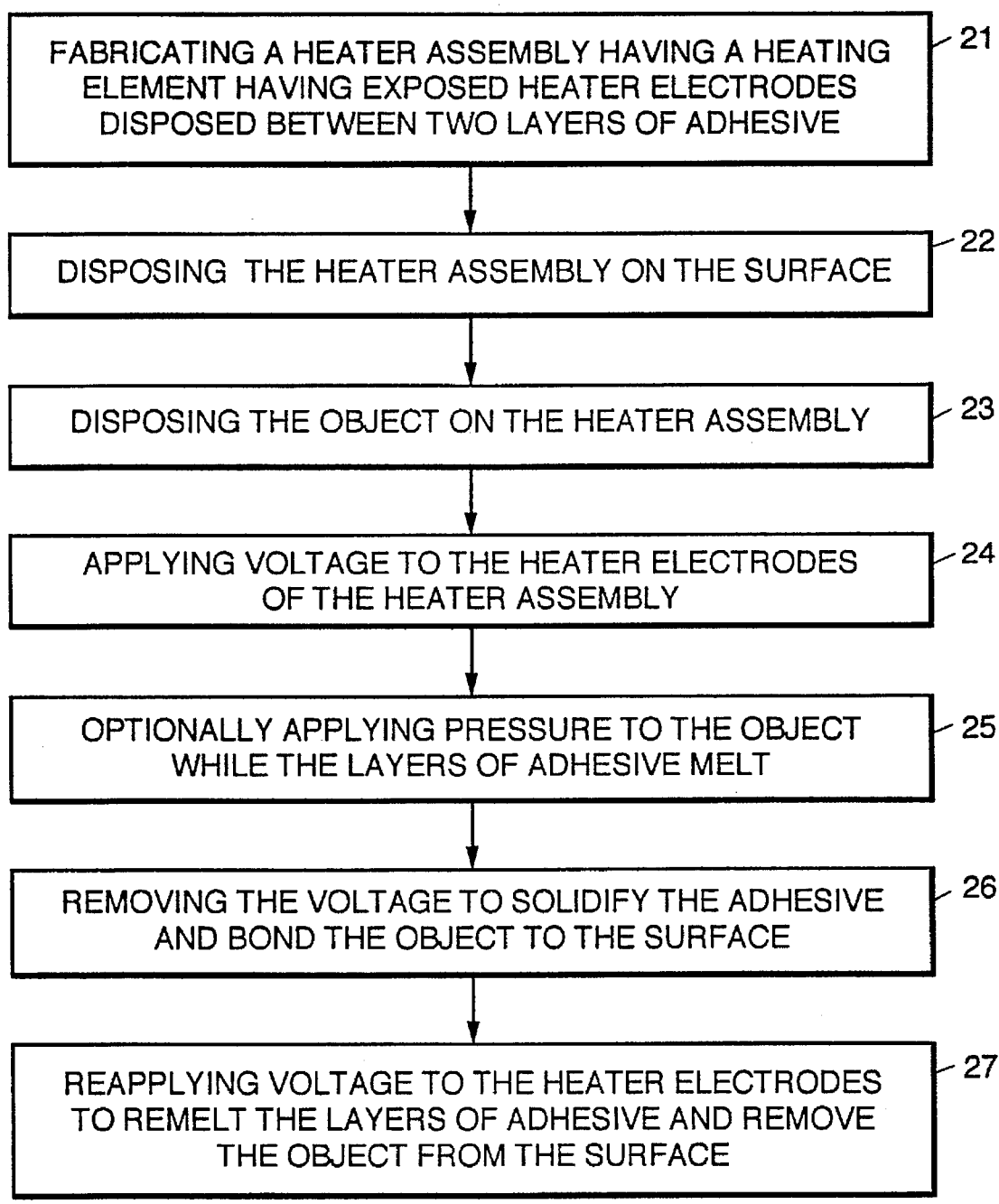
FIG. 5 illustrates a method for securing and removing an object to and from a surface.

For the purposes of completeness, FIG. 5 illustrates a method 20 for securing and removing an object 15 to and from a surface 16. The method 20 comprises the following steps. The first step comprises fabricating 21 a heater assembly 10 having a heating element 11 having exposed heater electrodes 14 disposed between two layers 12a, 12b of adhesive. The next step comprises disposing 22 the heater assembly 10 on the surface 16. The next step comprises disposing 23 the object 15 on the heater assembly 10. The next step comprises applying 24 voltage to the heater electrodes 14 of the heater assembly 10. The next step comprises applying 25 pressure to the object 15 while the layers 12a, 12b of adhesive soften. The next step comprises removing 26 the voltage to solidify the adhesive and bond the object 15 to the surface 16. To remove the object 15 from the surface 16 comprises reapplying 27 voltage to the heater electrodes 14 to soften the layers 12a, 12b of adhesive and remove the object 15 from the surface 16.

Thus there has been described a new and improved heater assembly and method employing the heater assembly for use in securing an object to a surface and removing the object from the surface. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A heater assembly comprising:

a heater element comprising a film having a continuous serpentine pattern and a higher density of said pattern at the edges of said heater element than at the center thereof and having heater electrodes connected to said heater element; and first and second layers of adhesive that encapsulate the heater element and leave said heater electrodes exposed.

2. The heater assembly of claim 1 wherein the layers of adhesive comprise layers of thermoplastic adhesive.

3. The heater assembly of claim 1 wherein the layers of adhesive contain a dielectric filler material that has a relatively high thermal conductivity.

4. The heater assembly of claim 2 wherein the layers of adhesive contain a dielectric filler material that has a relatively high thermal conductivity.

5. The heater assembly of claim 1 wherein the layers of adhesive comprise layers of urethane film containing aluminum nitfide filler material.

6. The heater assembly of claim 3 wherein the dielectric filler material comprises aluminum nitfide powder.

7. The heater assembly of claim 1 wherein the layers of adhesive comprise layers of urethane material.

8. The heater assembly of claim 1 wherein the heater element comprises a metal resistance alloy.

9. A method of securing an object to a surface comprising the steps of:

fabricating a heater assembly comprising:
- a heating element comprising a film having a continuous serpentine pattern and a higher density of said pattern at the edges of said heater element than at the center thereof and having heater electrodes connected to said heater element; and
- (b) first and second layers of adhesive that encapsulate the heater element and leave said heater electrodes exposed;

disposing the heater assembly on the surface;

disposing the object on the heater assembly;

applying voltage to the heater electrodes of the heater assembly;

applying pressure to the object while the layers of adhesive soften, and removing the voltage to solidify the adhesive and bond the object to the surface.

10. The method of claim 9 further comprising the step of:
reapplying voltage to the heater electrodes to soften the layers of adhesive and remove the object from the surface.

11. The method of claim 10 further comprising the steps of:
applying heat from a hot air heater to the object and to the surface to remove excess adhesive therefrom.

12. The method of claim 9 wherein the steps of disposing the heater assembly on the surface and disposing the object on the heater assembly comprise the steps of:
disposing the heater assembly on a surface of a circuit module;
disposing a ceramic package on an exposed surface of the heater assembly.

13. The method of claim 12 wherein the step of disposing a ceramic package on an exposed surface of the heater assembly comprises the step of disposing a multichip module on the exposed surface of the heater assembly.

* * * * *